US006560496B1

(12) United States Patent
Michener

(10) Patent No.: US 6,560,496 B1
(45) Date of Patent: May 6, 2003

(54) METHOD FOR ALTERING AC-3 DATA STREAMS USING MINIMUM COMPUTATION

(75) Inventor: James A. Michener, Grass Valley, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/345,656

(22) Filed: Jun. 30, 1999

(51) Int. Cl.[7] .............................................. G06F 17/00
(52) U.S. Cl. ........................... 700/94; 380/201; 386/94; 360/60; 369/53.21
(58) Field of Search ............................ 360/60; 380/200, 380/210, 236, 237, 238; 386/94, 111; 700/94; 369/47.12, 53.21; 705/57, 58

(56) References Cited

U.S. PATENT DOCUMENTS 5,987,417 A * 11/1999 Heo et al. .................... 704/500
6,212,199 B1 * 4/2001 Oxford ........................ 370/466
6,222,983 B1 * 4/2001 Heo ............................. 386/96
6,226,758 B1 * 5/2001 Gaalaas et al. ............. 713/600
6,392,969 B1 * 5/2002 Heo ......................... 369/47.15

\* cited by examiner

Primary Examiner—Forester W. Isen
Assistant Examiner—Tuan D. Nguyen
(74) Attorney, Agent, or Firm—John A. Crook; Michael W. Sales

(57) ABSTRACT

Methods and apparatus for broadcasting high quality audio "studio direct" with the same digital information employed in the studio by the video producer with AC-3 digital audio signals for broadcast to individual receiver decoders (IRD) include a method for altering meta data bits with minimum recalculation of cyclical redundancy check values. Control over individual data bits such as copyright bits is maintained by determining the bit status, comparing it to a preferred status, changing the status if it does not comply with the preferred status, and reevaluating cyclical redundancy check value in each data packet to avoid disruption in the data transmission. The calculation according to the present invention simplifies the hardware, storage and processing demands of previously known calculation techniques by forward and reverse comparisons of partial packet cyclic redundancy check (CRC) values.

9 Claims, 2 Drawing Sheets

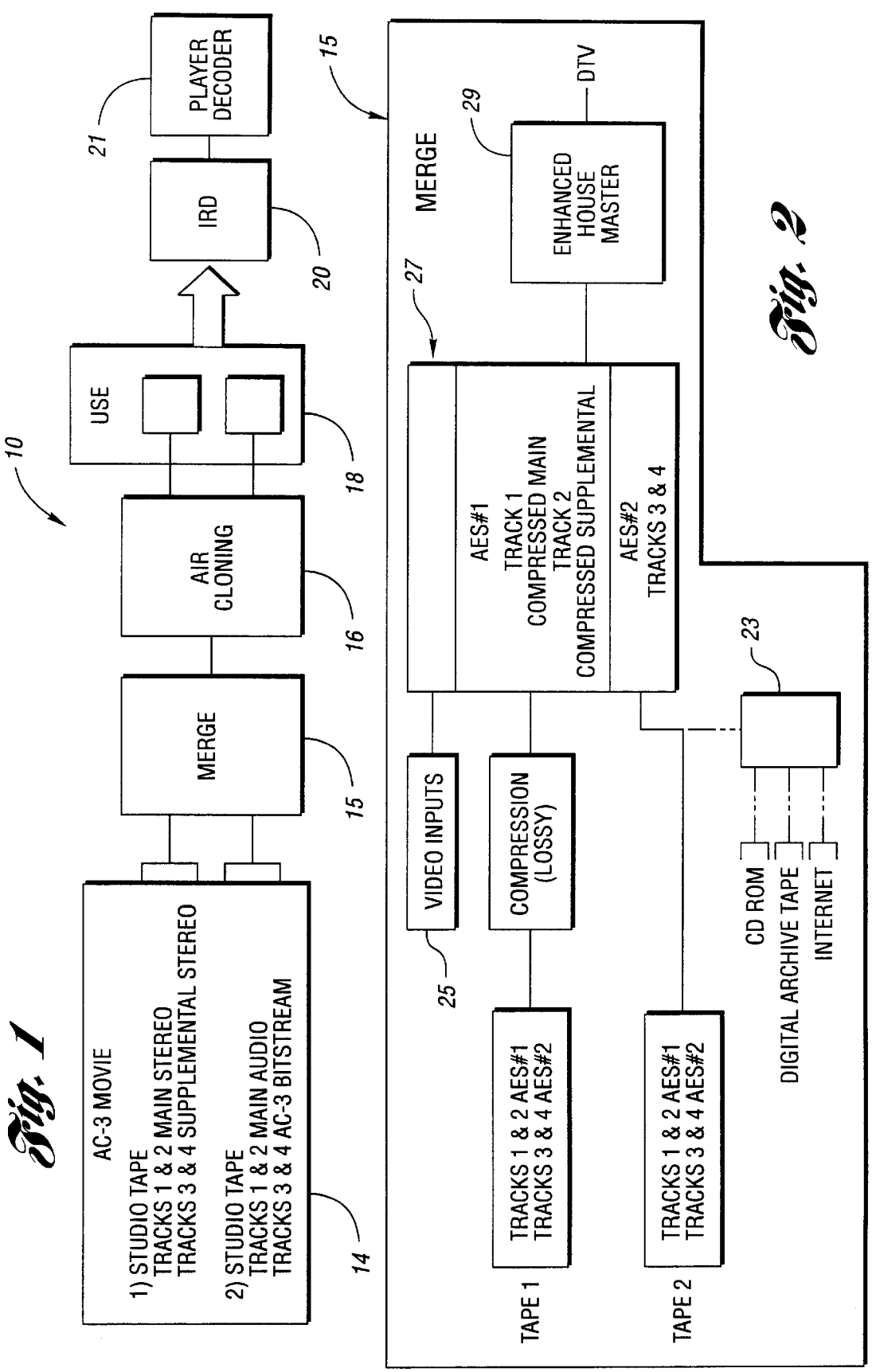

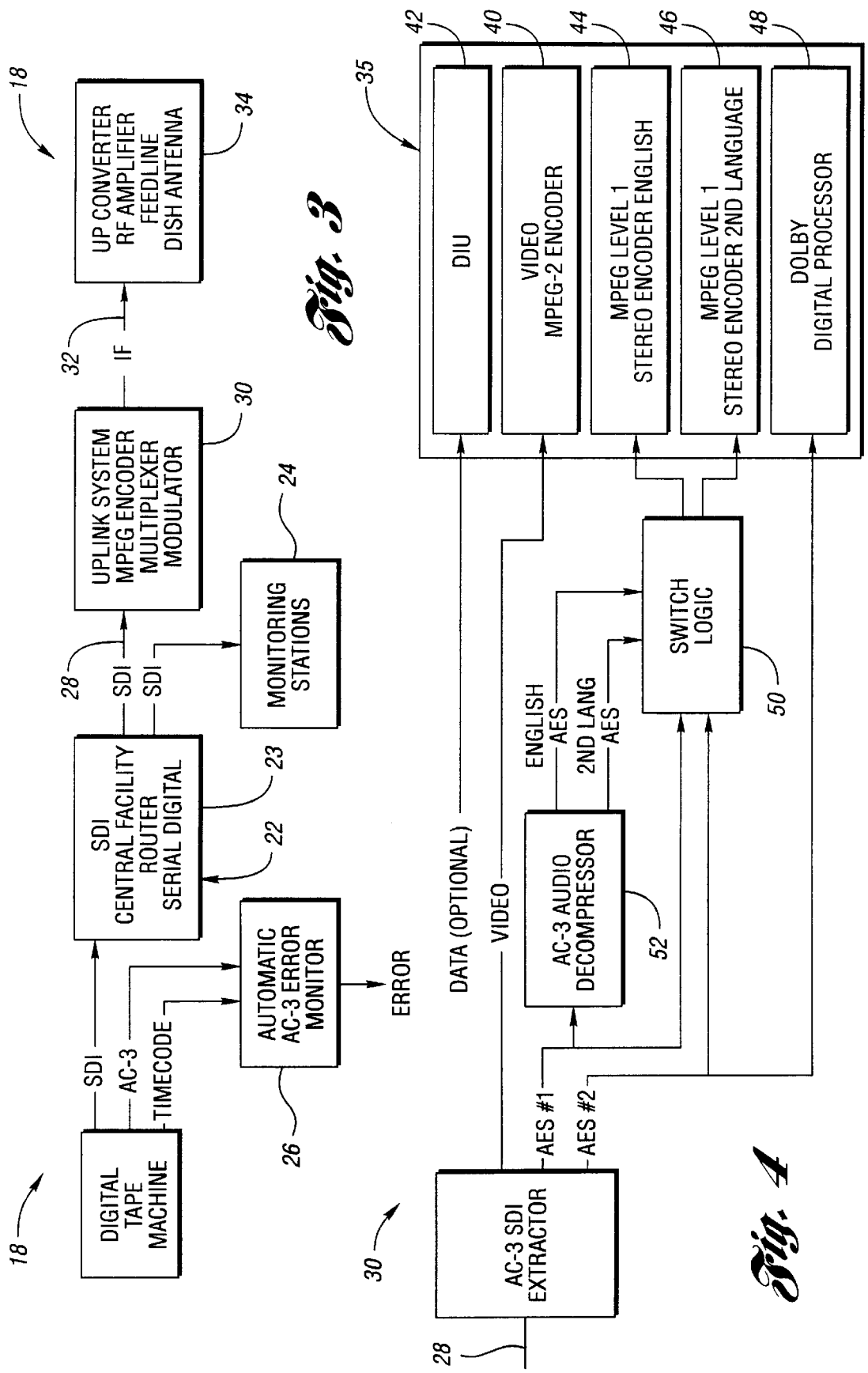

METHOD FOR ALTERING AC-3 DATA STREAMS USING MINIMUM COMPUTATION

TECHNICAL FIELD

The present invention relates to apparatus and methods for altering AC-3 data streams using minimum computation to limit disruption of the content during transmission of video and motion picture broadcasts with AC-3 audio compression systems accepted by the Advance Television Systems Committee (ATSC) for the new American terrestrial broadcast digital television standard with direct from the studio multi-channel audio capability.

BACKGROUND ART

In 1994, AC-3 marketed as Dolby Digital® was accepted by the ATSC as the audio compression system for the new American terrestrial broadcast digital television standard. At that time, DIRECTV® was already delivering digital transmission to the United States via satellite. For audio compression, DIRECTV® was broadcasting using "MPEG level 1" audio compression providing stereo audio. Dolby Digital® AC-3 won the ATSC selection committee by providing for slightly better compression as well as means of handling a wide array of programming modes up to "5.1 channel". 5.1 channels of surround sound provides for five distinct full fidelity channels, representing: right front, center front, left front, right rear and left rear channels, plus one limited bandwidth "Low Frequency Enhancement" channel. This selection of channels matches what has been available for presentation at movie theaters. The technical details for Dolby Digital® AC-3 is well described as part of the ATSC standard in the ATSC document A/52. This document, as well as the entire ATSC specifications, is available on the World Wide Web at www.atsc.org.

A satellite broadcaster provides multiple channels of recently released movies available for viewing on a Pay-Per-View (PPV) basis. This service competes with the VHS tape rentals market and companies. A competitive edge may be provided by the combination of convenience and quality.

Dolby Digital® with 5.1 channels surround sound has come available on DVD releases. Tape marketers would have a quality advantage for the home theater segment of this market unless technology could be developed to permit broadcasters to transmit such audio features. In the fall of 1997, DIRECTV® undertook the project to broadcast full 5.1 channels of audio into the homes of their customers. On Jul. 1, 1998 DIRECTV® began regular commercial broadcast of Dolby Digital 5.1 channel surround sound, begin the first broadcaster to provide such a service.

The prior practice for handling audio within a broadcast environment is as follows: Audio starts at the source as either analog audio, or digital audio in a generally uncompressed format. The audio is mixed to a final "release" version and then possibly lightly compressed for delivery to the broadcast facility. At that broadcast facility, the audio would again be brought down to an uncompressed format and at the last step in the broadcast chain be fed to a real time audio compression. This compression step would do the final "heavy" lossy audio compression for transmissions to the integrated receiver decoders (IRD) used by the end customers.

In this project DIRECTV® was first to bring Dolby Digital® that was encoded at the movie studio by broadcasting that audio "studio direct" to the customer. This required the development of specific applications in the art to meet this objective. These developments are not obvious from the existing AC-3 technology itself, and many obstacles had to be overcome to develop "studio direct" broadcasting of this multiple channel audio standard. Specifically, Dolby Digital® contains what is called as "meta data", that being ancillary data that is used to control the decoder process. This "meta data" routinely changes on a scene by scene basis, depending on plot of the movie. Examples of "meta data" present in a Dolby Digital® data stream are discussed below.

An LFE is a bit which enables the low frequency enhancement channel. Much of the time this is turned off, providing extra bandwidth availability for the main audio channels. It is enabled where the director wishes to "shake the house". A Dialogue Normalization is a value that defines the dynamic range of the audio with respect to the normal dialog level. Mix Level is an information quantity regarding how to mix a 5.1 channel presentation down to a stereo mix. A Surround Sound Mix Level is a control for the down mix (that reduces the number of channels finally output) levels of the surround sound channels for reproduction as stereo or Dolby Pro-Logic outputs. A Compression gain meta tag controls the decoder dynamic range when the end customer selects a mode of operation that provides a narrow dynamic range.

To do a proper job of encoding Dolby Digital® AC-3, all the above meta data must be supplied correctly by someone knowledgeable of the content. The person most qualified to do provide this information is the sound engineer responsible for mixing the movie at the studio. The ability to deliver to the end customer exactly the same compressed data as created by the sound engineer is a very desirable feature, but not readily available for AC-3 multiple channel audio with the previous broadcast technology. No previously known devices permitted the CRC values to be simply recalculated without substantial processing and memory for look up tables or the like if changes are made to meta tags or other bits during switching or processing of the signals.

This problem that AC-3 data packets contain imbedded meta data flags is exemplified by the "copyright" flag. This flag bit is used to indicate that this audio program material can not be recorded. The problem is that changing the one flag, for example, to comply with protection obligations, would require a recalculation of the CRC values, which is a process which is an computationally intensive operation.

The standard solution to this problem, the one used by Dolby Digital® and others, is to precompute the solutions of the CRC and store the values in large tables. This is fine if one has large amounts RAM or ROM to store these values, but such amounts are not available in many known designs of equipment.

DISCLOSURE OF INVENTION

The present invention overcomes the above-mentioned disadvantages by providing "studio direct" broadcasting with the audio quality identical to the DVD release, since it would indeed be the same bits that were on a DVD. The present invention simplifies recomputations of CRC when changes of the status of bits, such as meta tag, is changed in a packet of AC-3 audio signal bits carried by an AES-3 signal. As a result, the broadcast will air exactly the same bits that were released to the theaters, without the need for substantial processing and storage for look-up table data and the like that would otherwise be required. In the preferred embodiment, CRC recalculation was achieved with a 56001 processor that only had available 14K of data space and 14 K of code space on an already existing board.

If processing techniques require change of a bit in a packet, a process for checking the CRC, and checking where the CRC values are located within an AC-3 packet, is clearly stated in the ATSC document A/52 in section 7.10.1 incorporated herein by reference. A first CRC value is one word immediately after the sync word, (the second word in the packet), and the second CRC value is finally the last word in the packet. One sync word covers the first ⅝th of the packet. In the present invention, the second covers the last ⅜th of the packet. The first sync word is computed by running the CRC in reverse from the ⅝th's point within the packet.

The meta data is contained in the first eight words of the packet, well before the ⅝th point. To change this data the "normal method" would be to go to the ⅝th point within the packet and reverse calculate the CRC values going back, and then determine the CRC value that would be needed to drive this to zero. To achieve this in a timely fashion, Dolby Digital® suggest using look up tables, for the reverse calculation.

The algorithm employed is as follows: We already know the CRC value. All that is required is to calculate the data bit CRC value forward until we pass the meta data bit which needs to be changed, then change the meta data bit value and then compute the reverse CRC. The preferred embodiment, for example, a procedure was done in 20 CRC calculations, as compared to over 1000 CRC calculations, or 1000 or more looks ups into some very large tables, that were previously required. This algorithm gives at least a 50:1 savings in CPU utilization as well as saving a few megabytes of look up tables under working conditions where changes are made within the first 10 words of the packet and adds—another 10 words of a calculation.

BRIEF DESCRIPTION OF DRAWINGS

The present invention will be better understood by reference to the following detailed description of a preferred embodiment when read in conjunction with the accompanying drawing in which like reference characters refer to like parts throughout the views and in which, FIG. 1 is a block diagram of a system for preparing and transmitting studio original audiovisual programming with AC-3 standard multiple channel audio output to be ultimately received by the user at an individual receiver decoder device (IRD);

FIG. 2 is a diagrammatic view of the Merge portion of the system shown in FIG. 1;

FIG. 3 is a diagrammatic view of the portion of the broadcaster's use segment of the system of FIG. 1; and FIG. 4 is a diagrammatic view of an Uplink system portion shown in FIG. 3.

BEST MODE FOR CARRYING OUT THE INVENTION

The present invention overcomes the above mentioned disadvantages by a process to accomplish "studio direct" broadcast of video and television programming recorded with AC-3. The job of the movie studio audio engineer is first described briefly to put the invention in proper context. As inputs, the engineer takes what may be hundreds of tracks of audio and creatively mixes them to generate a plurality of outputs. The inputs can include: none to dozens of audio tracks that were recorded live and in sync with the live film action; none to dozens of audio tracks that were recorded from the musical score; none to dozens of audio tracks of sound effects tracks; or none to dozens of audio tracks from folio sound artists and other "sweetening sounds".

Each of these tracks is mixed down, on a scene by scene basis, to form many products. The first product is a multi-track master. This master contains a mix of all the live action sounds, folio sounds, music and special effects. This master generally contains separate dialog tracks, often times in several different languages. This master generally contains the mix down to multi-channel (typically 6 channel) theatrical release with additional dialog channels. From this master the audio engineer generates a stereo mix down of the audio for normal broadcast release. The audio engineer also tapes the multiple track master with a single language dialog making the final theatrical release. One of the theatrical release formats is Dolby Digital® AC-3, where the audio engineer, through a computer terminal, supplies all the meta data to the Dolby Digital® encoder. Another release format previously known is stereo/Dolby Prologic.

The preferred embodiment of the present invention may be implemented by ordering the studio to provide specific contents on two tapes as follows. One tape contains video and uncompressed stereo English digital data and uncompressed stereo second language audio digital data. This tape is identical to the tape that is normally delivered to broadcasters such as DIRECTV®. The second tape contains video, uncompressed stereo English and compressed Dolby Digital® AC-3. Since these tapes are made on Digital Betacam® machines, the audio is recorded digitally. Data can be supplied and delivered from the machine in AES (Audio Engineering Society) standard AES-3. Each AES-3 signal can carry an uncompressed stereo audio. AES-3 can also carry compressed Dolby Digital AC-3 data. The definition of how AC-3 is placed in an AES-3 is in the Appendix B of the ATSC document A/52 as well as documents IEC958 and IEC1937. This interface is well documented and incorporated herein by reference.

The two tape delivery means used in the preferred embodiment was driven by the proliferation of Sony Digital BetaCam® machines within DIRECTV®, but it is not, however, the only method. Dolby Digital® AC-3 is essentially data and can therefore be delivered by the same means as any data. Going through the process of making yet another tape is time consuming by the studio, in that for a two-hour movie, it takes two hours to make a copy of the AC-3 data to videotape. Traditional data delivery means are not constrained by the notion of "real time" and can accomplish the job much faster. Other applicable means for the present invention include but are not limited to the following examples. A CD-ROM may be loaded to contain the AC-3 data. This costs little, for example, about one dollar U.S., and can be done unless than 15 minutes. A digital computer archive tape may be prepared, such as 8 mm or DLT format. This would increase cost about five times but take less than 10 minutes to generate. A computer network, such as the Internet, could deliver Dolby Digital® AC-3, using TCP/IP protocols and file exchange protocols such as File Transfer Protocol (FTP). Depending on the line speed, this could be accomplished in seconds and does not require any media or transportation costs.

At the start of studio use of AC-3, broadcast devices previously available were not capable of playing Dolby Digital® data in sync with video. A prototype of such a device was developed within DIRECT® and is described below.

The two tapes specifically requested from the studio arrive by common carrier at DIRECTV® and are processed as follows to make an "air tape". The "air tape" is a tape that is played to broadcast on air and is made in the preferred embodiment as described below.

In the above description, all tape machines are Sony Digital Betacam® machines. The two tapes ordered are sync rolled. The stereo English and stereo second language audio tracks are placed into Tekniche® model 6047T compressor. This box does a lossy audio compression of audio and puts out a proprietary data stream of Tekniche, Inc. that occupies one full AES-3 digital audio stream. The pre-encoded AC-3 is then dubbed to the second AES-3 digital audio track on the Betacam® recorders. Signals are delayed in the dubbing process to assure synchronization between audio and video.

Although the above description explains the method currently in use, DIRECTV® is developing prototype equipment that would functionally replace the Sony Digital Beta-Cam® with a box that would play the raw "AC3" file as data in sync with video. As shown at 23 in FIG. 2, examples of inputs such as CD-Rom, Digital archive tape or an internet site may transfer AC-3 data to a converter 23 for compression and creation of the house master tape to be prepared for cloning and broadcast.

Video inputs 25 preparing at least one of a plurality of components that can be added to the house master tape 27. Inputs include a countdown clock, interstitials such as edited forms of trailers, rating labels, FBI warnings, "stereo" labels and the like to produce an enhanced house master 29. DIRECTV® produces a "count down clock" that is edited at the beginning of each tape. This segment is placed ahead of the content, such as a movie from studio, making a tape ready for air play. The "air play" tape then goes through a quality assurance step at DIRECTV® to verify that the tape was made correctly. A technician monitors the tape. With the large multitude of audio tracks, it is difficult for an operator to monitor all audio tracks. To aid the quality control function of the tape, DIRECTV® developed a box that automatically checks the AC-3 stream, logs errors and alarms. This device is also useful for quality assurance during the air play of the movie. This device was deemed beneficial and necessary since AC-3 is a fragile bitstream. This development of apparatus and method is described below.

Referring now to FIG. 2, a simplified block diagram illustrates the system employed at DIRECTV® to prepare for the studio direct "air" tape to actually be played on air. All blocks may function similarly to previously known broadcast mechanisms represented generally by studio output 14, cloning device 16 and the user 18, with the exception of the "Uplink System" that will be detailed below. The cloning 16 is used by the broadcaster for creating a clone tape that runs simultaneously in sync with another "air" tape for simultaneous back-up to preserve broadcast service. The user 18 routes and uplinks the data for broadcast transmission to the integrated receiver decoders (IRD's) 20. Each IRD 20 outputs consumer standard AES-3 signal to a player decoder 21 in a well known manner.

The user 18 of the preferred embodiment uses a Sony Digital BetaCam® that outputs digital video and audio out a SMPTE 259 serial digital interface known as Serial Digital Interface (SDI). The serial signal goes through a router 22 (FIG. 3), for example, a large central facility router 23 through which DIRECTV® sources feed this router, and this router 22 feeds all destinations. The router 22 preferably provides all on air switching, for example, switching between reels of a movie. The router 22 also permits an operator at a monitoring station 24 to observe any signal that is within the facility. The Digital BetaCam® AES-3 and timecode outputs can be fed to an automatic AC-3 monitor 26, either in preparation or during on-air use as a describer in this disclosure to log and report errors in the AC-3 signal.

The program's SDI signal 28 is routed to an Uplink System 30. The Uplink System performs the following operations: video compression using MPEG-2 in real time; decodes the English and second language stereo audio tracks; MPEG layer 1 encodes the English and second language stereo audio tracks; processes the AC-3 data; multiplexes each channel that includes these described tracks with other channels adding in conditional access and program guide information; scrambling; insertion of forward error correction (FEC) information, and modulating the signal to an IF 32 (FIG. 3). The IF signal is then up converted as shown at 34 to the uplink carrier frequency, amplified and fed to a dish antenna so the signal can be transmitted up to a satellite.

The "Uplink System" 30 shown in FIG. 4 contains an "encoder" 35. The encoder portion 34 of the "Uplink System" is detailed in FIG. 4. Specifically left out of this diagram is the multiplexer, scrambling, the FEC and the modulator, since they are not modified from known attributes that contribute to practice of the present invention. A data interface unit (DIU) 42, a video MPEG-2 encoder 40, an MPEG level 1 stereo encoder 44 for English, an MPEG level 1 stereo encoder 46 for an alternate language, and a Dolby Digital processor 48 are within the encoder 35 of the preferred embodiment. The encoder 35 outputs data in the format of DSS® transport packets. These packets are then scrambled, multiplexed together in the multiplexer, being combined with other channels as well as conditional access information and program guide in the uplink system 30.

The SDI signal 28 from the central facility router 24 feeds an AES-3 SDI extraction device, such as a Tekniche 6026E. This device separates the AES-3 data from the SMPTE 259 serial data stream. The SDI containing video is passed on to the MPEG-2 video encoder 40. The first AES-3 channel extracted is fed two places: to the input of a decompressor 52, preferably a Tekniche 6048T decompressor that readily recognizes the small data packages as AC-3 data or compressed, uncompressed PCM signal, and to the input of switch logic 50. The second AES-3 channel is fed two places: to the input of the switch logic 50 and to the input of a Dolby Digital processor 48.

The function of the "switch logic" 50 is to detect the presence of the compressed Tekniche signal on the first AES (#1) signal, each having two tracks of audio (i.e., L and R stereo PAIR). If the compressed signal is present, then the switch logic takes the decoded audio from the Tekniche 6048T and routes them to the two MPEG Level 1 stereo encoders 44 and 46. If the compressed Tekniche signal is not present on the AES #1 signal, then the source is assumed to be not Dolby Digital® compatible. Consequently, the switch routes AES #1 directly to the MPEG Level 1 Stereo Encoder for English 44, and AES #2 to the MPEG Level 1 Stereo Encode for second language 46. The function of the preferred embodiment of the "switch logic" is described in greater detail with respect to FIG. 5.

As shown in FIG. 4, the AES #2 signal is routed to the Dolby Digital® Processor 48. This DDP 48 takes AES signal as input and can identify if compressed data such as Dolby Digital® signal is present. If present, the processor 48 checks for discontinuities and modifies the signal, time stamps the signal and places the data into DIRECTV® transport packets, for example by arranging CRC values as described below, as specified by DIRECTV® specification DTV95 MDB02, "DSS® Transport Protocol Specification for the IRD", a proprietary and confidential document to DIRECTV, Inc., although other standards for transport such as MPEG 2 transport standard or ISO/IEC 13818-1 may be employed. Several unique and novel functions performed in this block are described below.

While this system of equipment and technologies were employed to provide "studio direct" Dolby Digital® signal, other components and systems may be employed without departing from the present invention. Where the exact same data that was generated by the audio production engineer at the studio for theatrical release may be delivered to the home through direct broadcast satellite.

For describing parts of the encoder modifications according to the present invention, a review of ATSC A/52, IEC 959 and IEC 1937 standards is described. Processed signals, such as Dolby Digital signal when sent in serial digital format is sent as packets of data on an AES-3 transport. The AES-3 is a serial transport mechanism that when operated at the industry standard audio sampling rate of 48 Khz can provide for the conveyance of 96,000 32 bit words per second. This provides for two samples, preferably a left and right sample, for each audio sample period of a frequency of 48 KHz. Of these 32 bits, many of them are overhead, conveying framing information, and ancillary information about what is carried as payload. When a Dolby Digital® processor signal is placed in an AES-3, each 32 bit word contains only a 16 bit word of AC-3 data. The data rides in place of the 16 most significant Pulse Code Modulation (PCM) values of audio. All industry-recording devices support recording of at least the minimum of 16 most significant bits of PCM data. As a result, data positions in that location can be recorded by machines traditionally designed for digital audio.

There are three ways in which Dolby Digital® AC-3 data can be arranged in an AES-3 stream: 1) occupying both left and right sample positions, called "32 bit mode" by Dolby Labs; 2) occupying only left sample positions, called "16 bit left" by Dolby Labs, and 3) occupying only the right sample position, called "16 bit right" by Dolby Labs.

In the preferred embodiment, the "32 bit mode" version of AC-3 at 48 Khz sampling is employed. This configuration is compatible with all consumer electronic equipment and is the most common arrangement of AC-3 data within an AES-3. The detailed discussions throughout this application will refer only to this mode. However, the present invention may be employed with the other two modes of mapping of AC-3 data into an AES-3 signal as well as with all the other possible sampling frequencies.

AC-3 data packets are spaced 32 ms, regardless of the mode. In the AES-3 packet can be viewed as a sequence of 16 bit words with an IEC958 header preceding the actual AC-3 data. An AC-3 packet example with an IEC958 header made up of four 16 bit words includes the words Pa, Pb, Pc, Pd, wherein:

Pa=0xF872 (0x=hexidecimal),

Pb=0x4E1F (0x=hexidecimal),

Pc="Burst value information" containing a streamidentification number assigned, typically if only one type of data is present, of the type of data that follows, and Pd="length code" equal to the number of bits of data that follow.

In addition, two 16 bit WORDS SYNC and CRC1 precede the data words, wherein:

SYNC="AC-3 sync frame"—first byte of AC-3 data, always equal to 0xB77 (0x=hexidecimal), and CRC1=First Cyclical Redundancy Check (CRC) value in the AC-3 packet.

Each following series of data words precedes a second cyclical redundancy check (CRC2) wherein:

CRC2=Second CRC value in the AC-3 packet after the data, is always a word the last word of the packet.

Between AC-3 packets, the value of data is not defined, however, the inter packet data is generally set to zero. For 48 KHz, "32 bit mode" AC-3, the IEC958 header and the AC-3 sync frame repeats every 3,072 words. (96,000 words per second*0.032 seconds between packets=3,072 words between packet starts).

AC-3 is particularly unfriendly in video environments. The AC-3 packet rate is (1/32 ms) or 31.25 Hz while the video frame rate is either 29.97 Hz for NTSC, or 25 Hz for PAL. Consequently there is no easy relationship between AC-3 frames and video frames.

AC-3 packets within an AES stream can be pictorially represented on a time line as spaced boxes, the start of the first box and the start of the second box being 32 ms from each other. Given this as a data stream, switches from one data stream to another, for example, from the original tape to the simultaneously played clone, or to the next tape in a series as occurs at the central facility router, may interrupt reception. At a minimum, switches must occur at reel changes, as well as at the start and at the end of a movie. The Dolby Digital Processor in the encoder must properly handle switches of incoming data stream to minimize the effect through the rest of the chain.

There are two parameters of the AC-3 signal that can alter what happens at the switch time: 1) the relative phase of the two AC-3 packets, and 2) the time at which the switch occurs.

For the unique case when the two AC-3 packet streams are identically in sync, where AES "A" is the "from stream", and AES "B" is the "to stream" that is being switched to are perfectly synchronized, if the switch occurs during the "extra time" between packets, switching can occur without error. If, however, the switch occurs in the middle of the packet, a problem is that the start data for the packet will be from stream "A" and the ending data will be from stream "B". The arrangement of CRC's at both the start and the end of the packet enables a standard decoder that check the CRC will pick up that there was an error in the packet and mute the receiver for that packet.

Detection of switching is more complex when there is a significant phase different between the AC-3 packets. With two out of phase streams, four possible switch-points will be considered.

Of the four switch points, where SW1=mid packet of stream A to mid packet of stream B, SW2=mid packet of stream A to no packet of stream B, SW3=no packet of stream A to no packet of stream B and no SW4=packet of stream A to mid packet of stream B, the worst case occurs if a switch occurring from AES "A" to AES "B" at SW3. This switch case is the worst case given the relatively long chain of operations that follow. There are buffers in both the multiplexers in the encoder, and buffers in the demultiplexer in the home receiver each expecting data that is on average a constant data rate. With a switch at SW3, almost immediately following the packet from stream "A", another perfectly valid packet from stream "B" appears. If the encoder were to process both packets, then during the 32 ms surrounding the switch there will be a near doubling of the overall data rate. This may cause major problems. The encoder buffer now has been over filled with data. To the extent there is overhead in the output fixed bit rate in the multiplexer, the encoder multiplexer would then utilize every available transport packet until it catches up with load. In the receiver, for a time period following the switch the receiver sees it is receiving buffer fill with the excess data. The rate at which the data is being removed is not changed. This can create a data overflow. Something must happen. At a point considerably after the switch, audio and video will be out of synchronization, or a buffer will overflow causing a noticeable error. The net effect is much like a train wreck, where the average number of cars that occupy a stretch of track at a given instance is exceeded. The exact results are difficult to predict, but is assured to be undesirable. The problem is made much worse if a series of switches happen in a relatively short period of time.

The solution implemented is a series of simple criteria for processing. Step one is to detect that a switch has occurred in the incoming AC-3 stream. A switch on the input can be created many places either in the router, or further upstream, such as in editing or even in the movie studio. Such a break or switch of the AC-3 may be called a "disruption". Normally, if nothing has been disturbed, the AC-3 packet sequence will repeat at exactly a 32 ms rate. The sequence of Pa, Pb, Pc, Pd, and AC-3 Sync Word repeats exactly every 3072 data words. Pa, Pb and the AC-3 sync word are fixed values and provide a clear indication of a start of a packet.

The first rule is: Never accept a packet before it is time. If an AC-3 packet begins before 3072 data words from the start of the last packet, it should be ignored and not transmitted.

The second rule is: If a disruption is detected, do not accept another AC-3 packet until at least "X" milliseconds after when an AC-3 packet was supposed to have started, or at least (32+"X") milliseconds from the last AC-3 packet start, wherein "X" is the amount of time that a given data rate would, given a specified, for example, 4K byte, receiver buffer size, will cause a data buffer under run in the receiver. For example, at 384 kbps, which is 48,000 bytes per second (384,000/8 bits per byte), and given a 2K byte nominal buffer, "X" would be 42 ms (2,000/48000). This length of time without data, should force a well designed receiver to detect that a disruption has occurred and with the resumption of data, again look to the present time stamp (PTS) values of the audio and video to re-establish lip sync.

If the first rule is followed, buffers will not overflow and a "train wreck is avoided". If the second rule is followed lip sync can be maintained. The worst side effect is that audio will dip to silence for a short period of time at a switch. Not a perfect solution, but a very workable solution given switches can be scheduled. Switches between reels, as well as the start and stop of the movies are generally selected at a point of relative silence. If this is the case, a disruption can occur completely undetectable by the listener.

A modification to the second rule that is less restrictive is as follows: If another packet comes within "N" milliseconds, after when an AC-3 packet was supposed to have arrived, then accept it. If it is greater than "N" milliseconds but less than "X" milliseconds, then do not accept it. This more complex rule permits minor slips in audio video synchronization. A couple millisecond slippage of lip sync is not very noticeable so it is not required to force a buffer to underflow in the receiver. This is a good "trick", however, it fails if the frequencies of disruptions are high.

The logic in the Dolby Digital® processor to first find and to determine if a "disruption" has occurred is described below at page 18. The proper handling of switching and disruptions can provide for delivery of a product to the home receiver that appears to be flawless. This algorithm is all that is required and enables AC-3 encoding to be accomplished at a location other than at the encoder. Again, "studio direct" AC-3 is accomplished.

The transmission of Dolby Digital signal is infested with copyright bits. A copyright bit is a flag embedded in the bit stream that relays to receiving device whether it is permitted to record the data. The ultimate purpose is to limit unauthorized copying of digital material and to protect the creator's property rights. It is customary to have a single means for flagging this information. In the preferred embodiment, there are a total of three locations that contains this information: 1) buried within the AC-3 packet; 2) within the MPEG-2 PES header structure; and 3) within the channel status bits of the AES-3 stream.

Items 1 and 2 in the list above are transmitted by DIRECTV®. Item 3 is a signal that must be regenerated by the IRD 20 when it outputs AC-3 to feed to an external AC-3 decoder 21. DIRECTV® set the requirement that there exists agreement between item 1 and item 2 to assure an unambiguous recreation of item 3 within the IRD. To be able to do "studio direct", the Dolby Digital Processor (DDP) 48 within the encoder must be able to monitor and control the copyright bits passing by in real time.

There may be three logical modes of operation:

INPUT: Where the encoder takes the AC-3 data that is presented to it, parse through the AC-3 packets and determine the state of the copyright bit and then based on that bit, set the copyright bit in the MPEG-2 PES header to match. The encoder generates the MPEG-2 PES header.

Always ON: Where the encoder is instructed either by an operation or an automation system to force copyright protection to this AC-3 audio stream on. Under this case, if the incoming AC-3 data is marketed with the copyright bit set to off, then that bit must be altered. The MPEG-2 PES header is generated with the copyright bit on. The problem here is that changing a bit in the AC-3 stream causes an error in the CRC codes. The CRC values must be recomputed and altered. This is a messy and at times compute intensive operation.

Always OFF: Where the encoder is instructed either by an operator or an automation system to force copyright protection to this AC-3 audio stream off. Under this case, if the incoming AC-3 data is market with the copyright bit set to on, then that bit must be altered. The MPEG-2 PES header is generated with the copyright bit off. The problem here is that changing a bit in the AC-3 stream causes an error in the CRC codes. The CRC values must be recomputed and altered. This is a messy and at times compute intensive operation.

The ATSC document A/52 page 94 defines the CRC checking mechanism for AC-3. Each frame contains two CRC values, one near the start of the packet, the second at the end of a packet. The CRC is based on the polynomial generator $X^{16}+X^{15}+X^2+1$. A/52 gives a hardware implementation of using a linear feedback shift register, and is employed for demonstration and example only in the preferred embodiment. However, the invention is not so limited and may be implemented by substantially different processing without departing from the present invention.

In the present invention, the first subroutines show that the basic functions can be implemented in software and how, although other implementations, for example, hardware, may be employed to practice the method. The algorithms regarding the linear feedback shift register according to the preferred embodiment are described below.

Given an input data word from the AC-3 stream, process the linear shift register for that AC-3 input word via an algorithm. Given 16 bit data word from the AC-3 stream called "DataIn", and a 16 bit CRC register value called "CRCReg", then assign the value of DataIn to a value 16 bit unsigned called Temp. Perform the following sequence 16 times. First find the most significant bit of the CRCReg. Then find the least significant bit of the Temp. If the first above is a 1, and if the bit in step No. 2 above is 0; or if No. 1 above is a zero and if No. above is a 1, then set CRCReg equal to the CRCReg exclusive or with the value 0x8004 (hexadecimal) plus one. Set Temp equal to the sum of Temp plus Temp. As a result, the CRCReg now contains the CRC value after the data input cycle.

The above is the normal operation of the shift register, as should be evident by the description in ATSC document A/52. In the following description, this will be called a Forward CRC operation.

Hardly obvious is the notion of running the CRC line shift register in reverse time, which is to say, if the state of CRC linear shift register is now "CRCReg" and the last data element processed was DataIn, determine the CRC linear shift register value before this data was processed with the following algorithm: Given the previous 16 bit AC-3 data word "DataIn" and the present 16 bit value of the CRC linear shift register "CRCReg" then assign DataIn to a 16 bit unsigned value called Temp. Do the following 16 times. First, determine the least significant bit of CRCReg, then divide the CRCReg by 2. Thirdly, find the least significant bit of temp. If the result from No. 1 above is a one, then set CRCReg equal to the exclusive or of CRCReg with 0x4002 (hexidecimal). If the result from No. 1 is zero and the result from NO. 3 is a one; or if the result from No. 1 is a one and the result from No. 3 is a zero, then set the most significant bit of CRCReg equal to a one. Finally, set Temp equal to Temp divided by 2. As a result, the CRCReg will equal to the state of the linear shift register before processing DataIn.

The above algorithm is essentially running the CRC in reverse direction. In the description below, this is called the "Reverse CRC Operation". This notion is not disclosed in prior art techniques including disclosed in A/52. To change the CRC bit, the linear shift register is first run forward past the CRC bit as described in A/52 document using the normal or "forward CRC operation". The bit is then changed and the CRC is run in reverse up to the point of the first CRC.

The following algorithm is used to recalculate the CRC value given the state of the CRC after the CRC value has been processed. Given linear shift register value after processing the first CRC through the linear shift register, and given that CRCSave is a saved value of CRC register upon entry of this routine, then set a 16 bit unsigned variable "Temp" equal to zero. Then set a 16 bit unsigned variable "CRCReg" equal to the current value of the linear shift register, and set a counter variable "Y" equal to zero. Afterward, perform the following 16 times: set X equal to the least two significant bits of CRCReg, and if X is equal to either 1 or 2, then set Temp equal the Or of Temp and 1 shifted to the right Y bits. Then determine the least significant bit of CRCReg, and set CRCReg equal to CRCReg divided by 2. If the result of No. 3 is a one, then set CRCReg equal to the exclusive or, then Increment Y. Then, set Z equal to the results of the reverse CRC process described above, where the input value is Temp and the CRCReg value is CRCSave. As a result, the new CRC value determined by the algorithm is the exclusive or of Temp and Z.

There are two possible playback tape formats within DIRECTV®. 1) Uncompressed stereo audio on each of the two AES-3 tracks of the Sony Digital BetaCam®, and 2) AES #1 of a Sony Digital BetaCam® comprised of two stereo audio signals, English and second language utilizing lightly compressed audio. AES#2 contains Dolby Digital AC-3. The first is the traditional format for regular programs where AC-3 is not available. The second is a "new" format of AC-3 compatible programming.

The Uplink system 30 has been developed to determine which of the two formats are being delivered and route the appropriate signals accordingly. Within the Uplink System 30 shown in FIG. 4 is a box 50 labeled Switch Logic and described in greater detail in a copending U.S. Patent Application entitled Delivery and Transmission of Dolby Digital AC-3 over television broadcast.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for controlling the status of copyright bits in an AES-3 signal stream including AC-3 packets comprising:
    establishing agreement between a desired copyright status buried in the AC-3 packet and the bits buried within the MPEG-2 PES header structure:
    regenerating the desired copyright bits in an IRD for output AC-3 to an external AC-3 decoder to comply with the agreed status, recalculating a partial CRC value by reversing the bit count from the point of the regenerated bit; and
    changing the CRC bit in response to said recalculating.

2. The invention as defined in claim 1 wherein said establishing agreement comprises parsing the AC-3 bit stream, determining the copyright bit status, setting the copyright bit status in MPEG-2 PES header, and generating MPEG-2 PES header in an encoder.

3. The invention as defined in claim 2 wherein said establishing agreement comprises setting the AC-3 audio stream copyright bit to be on, and recalculating the CRC bit in response to changing the copyright bit status in the AC-3 packet of the audio signal stream.

4. The invention as defined in claim 3 wherein said setting comprises an operator manually setting said copyright bit.

5. The invention as defined in claim 3 which said setting comprises automatically setting said copyright bit.

6. The invention as defined in claim 3 wherein said establishing agreement comprises setting the AC-3 audio stream copyright bit to be off, and recalculating the CRC bit in response to changing the copyright bit status in the AC-3 audio stream.

7. The invention as defined in claim 6 wherein said setting comprises an operator manually setting said copyright bit.

8. The invention as defined in claim 6 which said setting comprises automatically setting said copyright bit.

9. A method for altering meta data bits in an AES-3 bit stream comprising:
    checking the status of a meta data bit,
    altering the status of said meta data bit when it does not comply with a desired status,
    recalculating a partial cyclical redundancy check value by reversing the cyclical redundancy check calculation from the value of the changed bit, and
    revising the cyclic redundancy check value bit in the AES-3 bit stream in response to each recalculations.

* * * * *